US009906210B2

(12) United States Patent
Krassnitzer et al.

(10) Patent No.: US 9,906,210 B2
(45) Date of Patent: Feb. 27, 2018

(54) METHOD FOR PROVIDING SEQUENTIAL POWER PULSES

(71) Applicant: Oerlikon Trading AG, Trubbach, Trubbach (CH)

(72) Inventors: Siegfried Krassnitzer, Feldkirch (AT); Daniel Lendi, Grabs (CH); Markus Lechthaler, Feldkirch (AT)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 868 days.

(21) Appl. No.: 14/354,698

(22) PCT Filed: Oct. 8, 2012

(86) PCT No.: PCT/EP2012/004203
§ 371 (c)(1),
(2) Date: Apr. 28, 2014

(87) PCT Pub. No.: WO2013/060415
PCT Pub. Date: May 2, 2013

(65) Prior Publication Data
US 2014/0339917 A1     Nov. 20, 2014

(30) Foreign Application Priority Data

Oct. 28, 2011    (DE) ........................ 10 2011 117 177

(51) Int. Cl.
*C23C 14/34*        (2006.01)
*H03K 3/012*       (2006.01)
(Continued)

(52) U.S. Cl.
CPC ......... *H03K 3/012* (2013.01); *C23C 14/3485* (2013.01); *C23C 14/352* (2013.01); *C23C 14/54* (2013.01); *H01J 37/3467* (2013.01)

(58) Field of Classification Search
CPC .. H03K 3/012; C23C 14/3485; C23C 14/352; C23C 14/54; H01J 37/3467
See application file for complete search history.

(56) References Cited

U.S. PATENT DOCUMENTS 5,814,195 A * 9/1998 Lehan ................... C23C 14/352
                                                                    204/192.12
6,063,245 A * 5/2000 Frach ................... C23C 14/0036
                                                     204/192.13

(Continued)

FOREIGN PATENT DOCUMENTS

DE    10 2006 017 382 A1    5/2007
DE    20 2010 001 497 U1    4/2010
(Continued)

OTHER PUBLICATIONS

International Search Report for PCT/EP2012/004203 dated Apr. 4, 2013.

*Primary Examiner* — John J Brayton
(74) *Attorney, Agent, or Firm* — Pearne & Gordon LLP

(57) ABSTRACT

The present invention relates to a method for providing power pulses for PVD sputter cathodes which comprise a power consumption component and a cathode element, wherein during a power increase interval for a generator the power on the power consumption component is decreased and then the power on the cathode element is decreased, with changeover being effected such that the power draw from the generator providing the power does not have to be interrupted.

8 Claims, 2 Drawing Sheets

(51) Int. Cl.
    *H01J 37/34*     (2006.01)
    *C23C 14/35*     (2006.01)
    *C23C 14/54*     (2006.01)

(56) References Cited

U.S. PATENT DOCUMENTS

| | | | |
|---|---|---|---|
| 2004/0206620 A1* | 10/2004 | Wang | C23C 14/3407 |
| | | | 204/192.12 |
| 2005/0103620 A1* | 5/2005 | Chistyakov | C23C 14/0063 |
| | | | 204/192.12 |
| 2013/0276984 A1 | 10/2013 | Papa | |
| 2014/0061030 A1 | 3/2014 | Krassnitzer et al. | |
| 2015/0001063 A1* | 1/2015 | Krassnitzer | C23C 14/3464 |
| | | | 204/192.12 |

FOREIGN PATENT DOCUMENTS

| | | |
|---|---|---|
| DE | 10 2011 018 363 A1 | 10/2012 |
| WO | 2007/054048 A1 | 5/2007 |
| WO | 2008/071732 A2 | 6/2008 |
| WO | 2009/132822 A2 | 11/2009 |
| WO | 2012/143087 A1 | 10/2012 |

* cited by examiner

METHOD FOR PROVIDING SEQUENTIAL POWER PULSES

The present invention relates to a method for generating power pulses.

Such power pulses are needed for example in the context of HiPIMS technology. HiPIMS stands for High Power Impulse Magnetron Sputtering. This is a vacuum coating process wherein material is sputtered from a cathode by means of very high discharge currents, whereby it is ensured that the sputtered material is ionized positively to a high degree. If a negative voltage is simultaneously applied to the substrates to be coated, this has as a consequence that the positive ions generated by the sputtering are accelerated in the direction of the substrates and result in the formation of a thick layer. Powers of e.g. 40 kW and more are used in this connection. However, it is only possible to sputter material from the cathode in the framework of a short power pulse, since the cathode could suffer damage through overheating if power is applied for a longer period of time. It is thus necessary to limit the timespan during sputtering from a cathode at high power, which results in a maximum allowable pulse duration.

One approach for achieving this consists in dividing the whole cathode into partial cathodes and to output the power to the partial cathodes sequentially one after the other. This concept aims to provide several cathodes insulated from one another (here called partial cathodes) in the coating facility, so that a locally contained high discharge current can occur. A possible implementation of this approach is described in German patent application DE102011018363.

During a power pulse affecting one partial cathode, sputtering takes place from this cathode at a high discharge current density. Simultaneously, the other partial cathode or cathodes can cool down before a power pulse is applied on them again.

The inventors, however, have observed that the pulse duration itself has a considerable influence on the layer properties of the layer formed by means of magnetron sputtering. Generators are therefore required that are capable of producing both very short as well as relatively long-lasting high power pulses.

In general, generators reliably supply a constant voltage at constant current. They are called "power supply" in English, which translated into German is "Leistungsversorgung". The situation becomes challenging when, as described above, it becomes necessary to generate short power pulses with a high intensity. When switching on the power supply that is supposed to provide an output of e.g. 40 kW, a timespan on the order of approx. 700 μs will elapse with the commercially available power sources until the complete power output is supplied. If, as in the present case, power pulses with shorter pulse durations are required, the time available will have elapsed already before the complete power buildup has been achieved. The performance profile of such pulses is accordingly erratically dynamic and the sputtering process based on it yields poorly reproducible layers that are suboptimal in terms of their properties.

The present inventive method thus aims to provide a possibility to achieve power pulses with a defined profile in a simple manner, wherein the duration of the power pulses should be scalable in a simple manner over large intervals.

According to the invention, the task is solved in that the first power pulse intervals associated with a first partial cathode is designed to minimally overlap time-wise with the power pulse intervals associated with a second partial cathode in such a manner that when switching the output from the first partial cathode onto the second partial cathode, the generator supplying the power does not need to be switched off but rather the power draw from the generator occurs uninterruptedly and therefore a new power buildup is not necessary. During the period of overlap of the two power pulse intervals, the plasma burns only at the first partial cathode since the corresponding impedance as compared with the impedance of the not yet ignited second partial cathode is significantly lower. It is only when at the end of the first power pulse interval the first partial cathode is separated from the generator that the plasma ignites at the second partial cathode, yet so quickly that it results in an essentially continuous power draw from the generator. If there is a third partial cathode, it will be necessary to ensure that the power pulse interval associated with the third partial cathode overlaps (preferably minimally) with the power pulse interval associated with the second partial cathode, so that again when switching the output from the second partial cathode onto the third partial cathode, the power draw does not have to be interrupted. Minimal overlap in the present case means an overlap in the range of $x*0.01$ ms, wherein $0.5<x<10$. Generally speaking, it is necessary to make sure that the power pulse interval associated with the $n^{th}$ partial cathode overlaps (preferably minimally) with the power pulse interval associated with the $(n-1)^{th}$ cathode, so as to avoid an interruption of the power draw from the generator when changing over the output from the $(n-1)^{th}$ partial cathode onto the $n^{th}$ partial cathode. It is only when the output has been switched onto the last partial cathode and the power pulse associated with this last partial cathode has been supplied, i.e. when a power pulse cycle—hereinafter also called group—has been completed, that the power draw from the generator is interrupted. The subsequent pause in output is used for cooling the partial cathodes before the power pulse associated with the first partial cathode is again applied to it in the corresponding interval.

Such a procedure however results in that at least the power pulse supplied at the first partial cathode is in the temporal range of the power buildup of the generator and the corresponding power pulse has, accordingly, an undesirable profile. Therefore, according to a preferred embodiment of the present invention, prior to the application of power onto the first partial cathode, power is applied to a so-called dummy cathode for at least approximately the power buildup interval. This is essentially a power absorber and not a cathode used for the application. It is necessary to provide for the power pulse interval associated with the first partial cathode to minimally overlap with the power buildup interval, whereby during changeover From the dummy cathode onto the first partial cathode, an interruption of the power draw from the generator is avoided and in the course of the first power pulse interval essentially the full power is already available. The above-mentioned dummy cathode can for example be executed with an electric circuit with an ohmic resistance at which the corresponding voltage drops and the power is thus converted into heat.

As previously mentioned, the power buildup interval can very well be on the order of about 700 μs. The output supplied during this interval by the generator to the dummy cathode does not benefit the coating process, it is thus lost and constitutes a loss. This is unproblematic if the power pulse cycle, i.e. the group interval, is large as compared with the power buildup interval and the power loss thus constitutes merely a small percentage. This is however problematic if the power pulse intervals become so small that the power buildup interval as compared to the group interval becomes indeed relevant. In such a case, a significant and thus unacceptable loss is incurred.

This can be avoided with a further preferred embodiment of the present invention. The inventors have in fact realized that precisely in the case of short power pulse intervals, a cooling of the partial cathodes is not actually necessary. In this case, a second power pulse cycle follows on the first power pulse cycle. Care must be taken here that the first power pulse interval of the second power pulse cycle (i.e. of the second group) overlaps minimally with the last power pulse interval of the first power pulse cycle of the first group, so that the changeover of the power from the last partial cathode onto the first partial cathode is possible without interruption of the power draw from the generator. This prevents a power buildup interval for the second group and the loss of power inherent in diverting the power on the dummy cathode. It is possible to arrange in a corresponding manner as many groups one after the other until due to the heat generation occurring at the partial cathodes an actual interruption of the power supply must or should take place. In such a group formation, it is only necessary once at the beginning of the run to direct the power during the power buildup interval onto the dummy cathode.

The invention will now be explained in detail and on the basis of diagrams by way of example using sputter technology.

Figure 1:
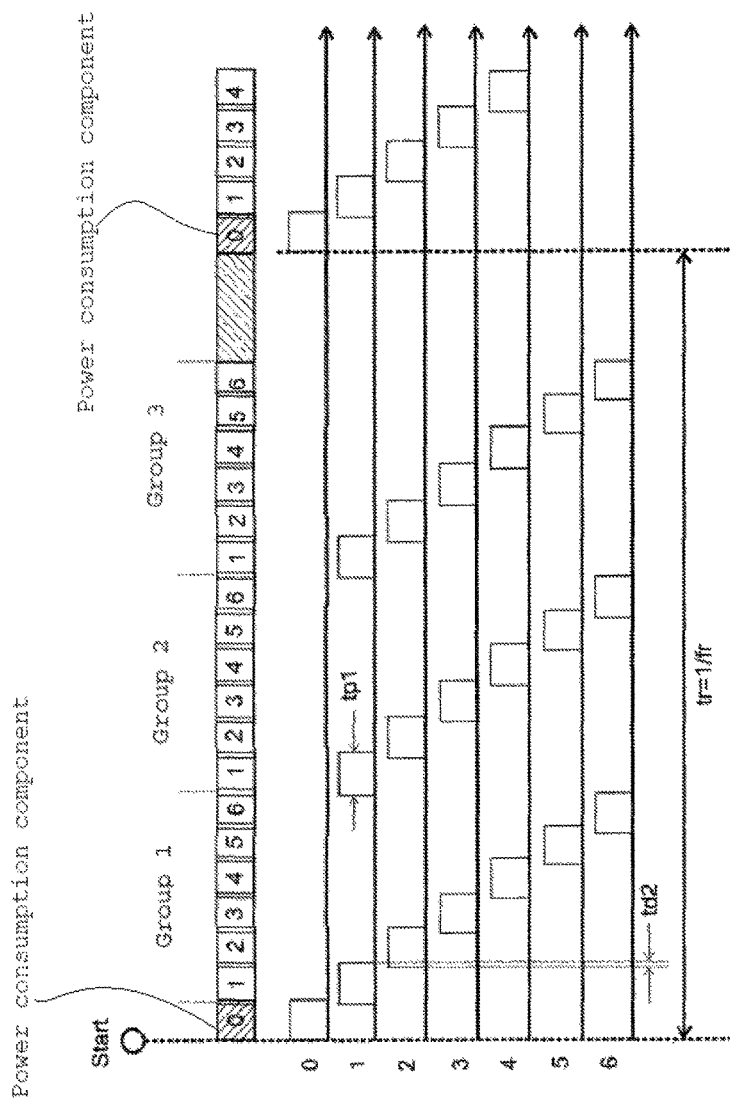
FIG. 1 represents diagrammatically such a group formation.
Figure 2:
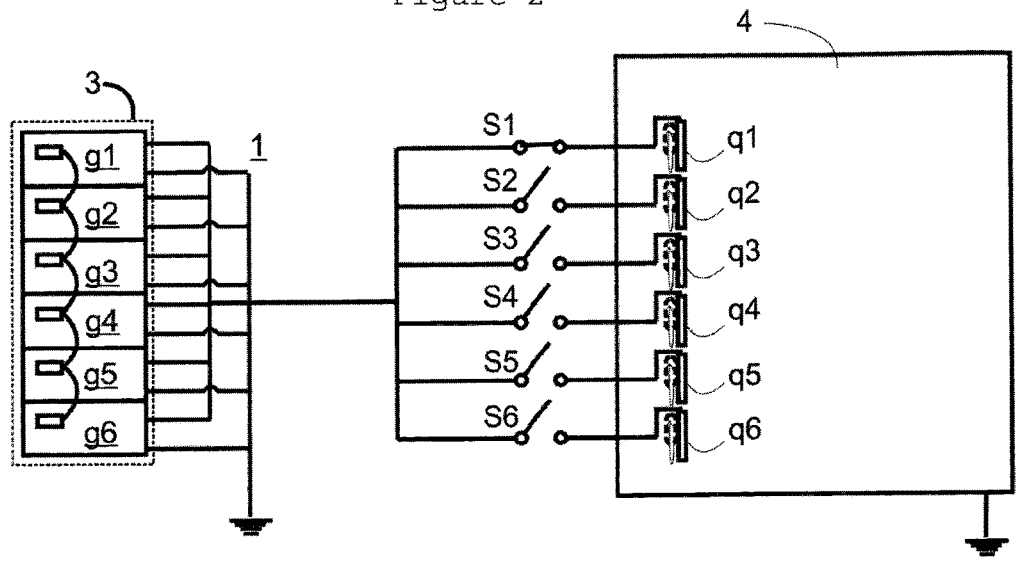
FIG. 2 shows a layout according to one embodiment according to which a power supply unit 3 comprises generators g1 to g6 configured as master-slave unit and that can be connected through the switches S1 to S6 with the partial cathodes q1 to q6.
Figure 3:
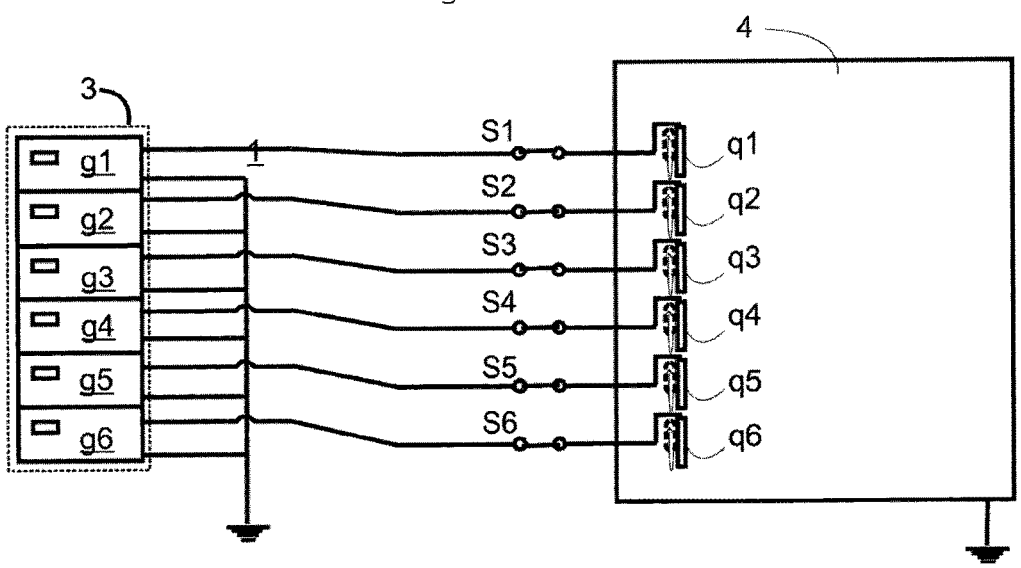
FIG. 3 shows the layout according to FIG. 2, wherein the master-slave unit has been broken up so that each of the partial cathodes can be powered directly by a generator.

The following abbreviations will be used for the examples hereinafter:

| | |
|---|---|
| Pavg | average sputter output |
| Pmax | maximum sputter output (pulse power) |
| tpn | pulse length |
| tdn | pulse lag |
| N | number of groups (N = 0 . . . 500) |
| n | channel number (= number of partial cathodes, n = 0 . . . 6, n = 0 corresponds to the dummy cathode) |
| fr | repetition frequency |
| tr | repetition period = 1/fr |

In order to avoid overheating of the cathodes, it is assumed by way of example that within a power run, the total amount of time during which power is applied to a partial cathode must be less than 100 ms:

$$(tpn-tdn)*N<100ms=Tmax$$

EXAMPLE 1

In the framework of the first example, power is applied to the dummy cathode for 0.5 ms, i.e. the loss interval tp0 lasts 0.5 ms and thus surely includes the power buildup interval of approx. 0.25 ms. Additionally to the dummy cathode, 6 partial cathodes are used. The power pulse interval during which power is applied to a partial cathode within a group is specified at tp1-6=0.2 ms and the overlap of the power pulse intervals is specified at td1-6=0.02 ms. Overall 10 power pulse cycles are performed, i.e. 10 groups together form one formation or run. The total run interval thus lasts 10*6*(0.2 ms−0.02 ms)+0.5 ms=10.8 ms+0.5 ms=11.3 ms.

Therefore, a loss interval of 0.5 ms is offset against a timespan used for coating purposes of 10.8 ms for the power supply. By comparison to the power loss on the dummy cathode, more than 20 times as much power is thus used for coating purposes.

If 40 kW are then applied at a partial cathode during the power pulse interval and an average sputtering output of 5 kW is specified at each partial cathode, the total run interval should be repeated with a frequency of 69.4 Hz, because:

$$(tpn-tdn)* N*Pmax*fr=0.18ms*10*4.0kW*69.4Hz=5kW$$

is true.

This is offset by an average power loss at the dummy cathode of maximum 0.5 ms*40 kW*69.4 Hz=1.39 kW. A repetition frequency of 69.4 Hz corresponds to a repetition period of 14.4 ms. For a duration of the total run interval of 11.3 ms, this means that between the runs a pause of 3.1 ms needs to be inserted.

EXAMPLE 2

In the frame of the second example, the power pulse interval is reduced to 0.07 ms and the number of groups is increased to 100. The other parameters remain the same. The total run interval thus lasts 100*6*(0.07 ms−0.02 ms)+0.5 ms=30 ms+0.5 ms=30.5 ms.

Therefore, a loss interval of 0.5 ms is offset against a timespan used for coating purposes of 30 ms for the power supply. By comparison with the power loss on the dummy cathode, more than 60 times as much power is thus used for coating purposes.

If 40 kW are then applied at a partial cathode during the power pulse interval and an average sputtering output of 5 kW is specified at each partial cathode, the total run interval should be repeated with a frequency of 25 Hz, because:

$$(tpn-tdn)* N*Pmax*fr=0.05ms*100*40kW25Hz=5kW$$

is true.

This is offset by an average power loss at the dummy cathode of maximum 0.5 ms*40 kW*25 Hz=0.5 kW: A repetition frequency of 25 Hz corresponds to a repetition period of 40 ms. For a duration of the total run interval of 30.5 ms, this means that between two runs, a pause of 9.5 ms needs to be inserted.

EXAMPLE 3

In the frame of the third example, the power pulse interval is reduced to 0.05 ms and the number of groups is increased to 1000. The other parameters remain the same. The total run interval thus lasts 1000*6*(0.05 ms−0.02 ms)+0.5 ms=180 ms+0.5 ms=180.5 ms.

Therefore, a loss interval of 0.5 ms is offset against a timespan used for coating purposes of 180 ms for the power supply. By comparison with the power loss on the dummy cathode, more than 360 times as much power is thus used for coating purposes.

If 60 kW are then applied at a partial cathode during the power pulse interval and an average sputtering output of 5 kW is specified at each partial cathode, the total run interval should be repeated with a frequency of 2.7 Hz, because:

$$(tpn-tdn)* N*Pmax*fr=0.03ms*1000*60kW*2.7Hz=4.86kW$$

is true.

This is offset by an average power loss at the dummy cathode of maximum 0.5 ms*60 kW*2.7 Hz=81 W. A repetition frequency of 2.7 Hz corresponds to a repetition period of 360 ms. For a duration of the total run interval of 180.5 ms, this means that between two runs, a pause of 179.5 ms needs to be inserted.

EXAMPLE 4

In the frame of the fourth example, the power pulse interval is reduced to 0.05 ms and the number of groups is maintained at 1000, with the other parameters remaining the same. The total run interval thus lasts 1000*6*(0.05 ms−0.02 ms)+0.5 ms=180 ms+0.5 ms=180.5 ms.

Therefore, a loss interval of 0.5 ms is offset against a timespan used for coating purposes of 180 ms For the power supply. By comparison with the power loss on the dummy cathode, more than 360 times as much power is thus used for coating purposes.

If no longer 60 kW as in example 3 but rather merely 33 kW are then applied at a partial cathode during the power pulse interval and an average sputtering output of 5 kW is specified at each partial cathode, the total run interval should be repeated with a frequency of 5.05 Hz, because:

$$(tpn-tdn)*N*Pmax*fr=0.03ms*1000*33kW*5.05Hz=5kW$$

is true.

This is offset by an average power loss at the dummy cathode of maximum 0.5 ms*33 kW*5.05 Hz=83 W. A repetition frequency of 5.05 Hz corresponds to a repetition period of 198 ms. For a duration of the total run interval of 180.5 ms, this means that between two runs, a pause of merely 17.5 ms needs to be inserted.

As the examples outlined above show, the inventive method allows a simple scaling of pulse duration, pulse height, pulse repetition frequency as well as the exact definition of the pulse profile for a negligibly small power loss. All these values, which can be subsumed under the keyword scalable pulse characteristics, have in sputtering, and in particular in the context of HiPIMS technology, a direct influence on the properties of the layers thus produced. Although the description of the invention describes the supply of power pulses in the frame of sputter technology, it is advantageously applicable wherever a comparatively high output in the frame of pulses is to be applied to a load.

FIG. 1 shows the situation corresponding to the examples both as unified run as well as split up into the loss interval (0) and the power pulse intervals at the partial cathodes (1-6). In this respect, the horizontal axis represents the time axis and the vertical axis corresponds to the power supplied by the generator. However, only 3 groups are shown in the figure.

As described above, it is possible by introducing a dummy cathode for a precisely defined power pulse profile to be applied to each of the partial cathodes, since this dummy cathode can process the power supplied during the power buildup interval. As the inventors have discovered, this dummy cathode is however also very useful if so-called arcing arises during the sputtering. If indeed such an arcing—also called flashing—is detected by means of a detection device, the generator is usually switched off, which means that within a run there is no longer an uninterrupted power supply by the generator. In contrast thereto, it is possible by means of the dummy cathode to redirect the power onto this cathode and the generator can supply its power without disturbance and without interruption.

It must still be noted that the inventive method of providing sequential power pulses enables simple generators to be used. The generator can for example be a power supply unit that is configured as a master-slave unit. Master-slave configuration is understood as the parallel switching of the outputs of two or several generators, wherein the power to be set at one of the generators (the master) is chosen and the other generators are electronically connected in such a way that they follow the master in terms of their settings. This has in particular also the advantage that if it becomes necessary to switch from HiPIMS sputtering to conventional sputtering, the master-slave configuration can be broken up and the master or a slave can be allocated to the partial cathodes.

The partial cathodes preferably each comprise behind the targets moving magnet systems that ensure that the respective racetrack moves over the respective partial target. If the facility is operated in HiPIMS mode, according to the invention the magnet systems that preferably rotate behind the partial targets move with a frequency that preferably forms no rational ratio with the frequency of the recurring power pulses of the sputtering source. This ensures that material is removed uniformly from the target surface.

A method has been described for providing power pulses with scalable power pulse interval for operating a PVD sputter cathode, wherein the PVD sputter cathode comprises a first partial cathode and a second partial cathode, wherein for the partial cathodes a maximum average power application is specified and wherein the duration of the power pulse intervals is specified and wherein the method comprises the following steps:
   a) supplying a generator with predetermined power supply that is preferably constant at least after switching on and after completion of a power buildup interval
   b) switching on the generator
   c) connecting the first partial cathode to the generator, so that power from the generator is applied to the first partial cathode
   d) disconnecting the generator from the first partial cathode after expiration of a prescribed first power pulse interval corresponding to the first partial cathode
   e) connecting the second partial cathode to the generator, so that power from the generator is applied to the second partial cathode
   f) disconnecting the generator from the second partial cathode after expiration of a prescribed second power pulse interval corresponding to the second partial cathode wherein the first power pulse interval starts temporally before the second power pulse interval and the first power pulse interval ends temporally before the second power pulse interval, wherein the steps d) and e) are executed in such a way that the first power pulse interval and the second power pulse interval overlap time-wise and all power pulse intervals together form a first group, so that the power supply from the generator persists continuously without interruption from the beginning of the first power pulse interval until the end of the second power pulse interval and there is no second power buildup interval.

The temporal overlapping of the first power pulse interval and of the second power pulse interval should preferably not make up more than x % of the power pulse intervals resp. in case the first power pulse interval differs in duration from the second power pulse interval, not more than x % of the power pulse interval of the shorter duration, wherein x≤20, preferably x≤10.

The PVD sputter cathode can comprise at least a further partial cathode, preferably several further partial cathodes, wherein the further partial cathode is connected to and disconnected from the generator in accordance to steps e) and f), wherein the power pulse intervals associated with the respective further partial cathode whose turn it is overlaps in time with the power pulse interval corresponding to the immediately preceding partial cathode and the first, second and the further power pulse interval or intervals together form the temporally uninterrupted first group, so that the power supply from the generator persists continuously without interruption during the group interval formed by the first group and there is no second power buildup interval.

It is possible to connect to the first group a second group, within which power pulses are applied to the first, second and if applicable further partial cathodes corresponding to the first group within mutually overlapping power pulse intervals, wherein the second group can be connected to the first group in such a way that the first power pulse interval of the second group overlaps with the last power pulse interval of the first group, so that the power supply from the generator persists continuously without interruption From the beginning of the first power pulse interval of the first group until the end of the last power pulse interval of the second group and there is no second power buildup interval.

According to the conditions formulated for groups 1 and 2, it is possible to connect N groups to one another, wherein N is a whole number>1.

The number N of the groups should preferably be chosen at most only so large that for each partial cathode n it is true that the sum of the power pulse intervals tpn associated with it minus the respective overlap tdn over all groups 1 to N does not exceed a maximum time of 100 ms.

During a loss interval, the output supplied by the generator can be released to a load that is not used for example for a coating, wherein the loss interval comprises at least the power buildup interval and the loss interval overlaps with the first power pulse interval of the first group and the loss interval forms together with the groups an interrupted run.

The method outlined above can be repeated multiple times and the generator can be switched off for a pause each time after the last power pulse interval of the last group and the pause can be chosen to be so long that the temporally averaged output supplied at the partial cathodes corresponds to a prescribed value, taking into account the pauses.

It is possible with the method described above to perform a HiPMS process, wherein the prescribed output of the generator is at least 20 kW, preferably at least 40 kW and even more preferably 60 kW.

In the context of the HiPIMS method, the parameters can preferably be chosen such that the temporally averaged output supplied to the partial cathodes is less than 10 kW and preferably 5 kW, wherein the discharge current density prevailing momentarily and locally at the partial cathodes is preferably greater than 0.2 A/cm$^2$.

A method has been disclosed for providing power pulses with scalable power pulse interval for operating a PVD sputter cathode, wherein the PVD sputter cathode comprises a power consumption component and a first partial cathode, wherein for the partial cathode a maximum average power application is specified and wherein the duration of the power pulse intervals is specified and wherein the method comprises the following steps:

a) supplying a generator with predetermined power supply that is preferably constant at least after switching on and after completion of a power buildup interval b) switching on the generator c) connecting the power consumption component to the generator, so that power from the generator is applied to the power consumption component during the power buildup interval d) disconnecting the generator from the power consumption component after expiration of the power buildup interval e) connecting the first partial cathode to the generator, so that power from the generator is applied to the first partial cathode f) disconnecting the generator from the first partial cathode after expiration of a prescribed first power pulse interval corresponding to the first partial cathode.

The method is characterized in that steps d) and e) are executed in such a way that when the first partial cathode is connected to the generator, there is no second power buildup interval, wherein this is preferably achieved in that the power buildup interval and the first power pulse interval overlap time-wise and the power supply of the generator does not need to be interrupted.

In the description, the word "dummy cathode" has been used with some frequency. This is not necessarily an actual cathode but is to be understood as identical with the power consumption component. It is a characteristic of the power consumption component that it is not used as material supplier for the substrates to be coated or processed.

In the description, the word partial cathode is to be understood in that several electrically insulated cathodes form a cathode system and these cathodes are designed as part of the system and thus as partial cathodes.

The method can furthermore include the following steps:

g) connecting a second partial cathode to the generator, so that power from the generator is applied to the second partial cathode h) disconnecting the generator from the second partial cathode after expiration of a prescribed second power pulse interval corresponding to the second partial cathode wherein the steps f) and g) are executed in such a way that the power supply from the generator persists continuously without interruption from the beginning of the power buildup interval until the end of the second power pulse interval and there is no second power buildup interval, wherein this is preferably achieved in that the first power pulse interval and the second power pulse interval overlap time-wise, wherein the first power pulse interval starts temporally before the second power pulse interval and the first power pulse interval ends temporally before the second power pulse interval.

It is possible for n further partial cathodes to be connected sequentially in turn to the generator and disconnected from the latter in accordance with steps f), g) and h), wherein preferably the n−1$^{th}$ power pulse interval overlaps time-wise with the n$^{th}$ power pulse interval.

It is possible to provide means for detecting arcing and, in the event of an arc being detected, to connect the power consumption component to the generator and to disconnect the currently connected partial cathode from the generator in such a way that the power supply from the generator is not interrupted.

In the present description, arcing is understood to be mostly the electric breakdown that results in a sudden collapse of the voltage and/or increase of the current.

What is claimed is:

1. Method for providing power pulses with scalable power pulse interval for operating a PVD sputter cathode, which comprises a power consumption component and at least a first cathode or a first partial cathode and a second partial cathode, wherein for the first cathode or the first partial cathode a maximum average power application is specified and wherein the duration of the power pulse intervals is specified and wherein the method comprises the following steps:
  a) supplying a generator with a predetermined constant power supply at least after switching on and after completion of a power buildup interval;
  b) switching on the generator;
  c) connecting the power consumption component to the generator, so that power from the generator is applied to the power consumption component during the power buildup interval;
  d) disconnecting the generator from the power consumption component after expiration of the power buildup interval;
  e) connecting the first cathode or the first partial cathode to the generator, so that power from the generator is applied to the first cathode or the first partial cathode;
  f) disconnecting the generator from the first cathode or the first partial cathode after expiration of a prescribed first power pulse interval corresponding to the first cathode or the first partial cathode,
    wherein the power consumption component is not used as material supplier for the substrates to be coated or processed and the steps d) and e) are executed in such a way that when the first cathode or the first partial cathode is connected to the generator, there is no second power buildup interval, and the power supply of the generator is not interrupted;
  g) connecting the second partial cathode to the generator, so that power from the generator is applied to the second partial cathode; and
  h) disconnecting the generator from the second partial cathode after expiration of a prescribed second power pulse interval corresponding to the second partial cathode,
    wherein the steps f) and g) are executed in such a way that the power supply from the generator persists continuously without interruption from the beginning of the power buildup interval until the end of the second power pulse interval and there is no second power buildup interval, and
    wherein n further partial cathodes are connected sequentially in turn to the generator and disconnected from the latter in accordance with steps f), g) and h), wherein the n-1$^{th}$ power pulse interval overlaps time-wise with the n$^{th}$ power pulse interval.

2. Method according to claim 1, wherein means for detecting arcing are provided and, in the event of an arc being detected, the power consumption component is connected to the generator and the currently connected cathode or partial cathode is disconnected from the generator in such a way that the power supply from the generator is not interrupted.

3. Method for providing power pulses with scalable power pulse interval for operating a PVD sputter cathode, which comprises a power consumption component and at least a first cathode or a first partial cathode, wherein for the first cathode or the first partial cathode a maximum average power application is specified and wherein the duration of the power pulse intervals is specified and wherein the method comprises the following steps:
  a) supplying a generator with a predetermined constant power supply at least after switching on and after completion of a power buildup interval;
  b) switching on the generator;
  c) connecting the power consumption component to the generator, so that power from the generator is applied to the power consumption component during the power buildup interval;
  d) disconnecting the generator from the power consumption component after expiration of the power buildup interval;
  e) connecting the first cathode or the first partial cathode to the generator, so that power from the generator is applied to the first cathode or the first partial cathode; and
  f) disconnecting the generator from the first cathode or the first partial cathode after expiration of a prescribed first power pulse interval corresponding to the first cathode or the first partial cathode,
    wherein the power consumption component is not used as material supplier for the substrates to be coated or processed and the steps d) and e) are executed in such a way that when the first cathode or the first partial cathode is connected to the generator, there is no second power buildup interval, and the power supply of the generator is not interrupted, and
    wherein the power buildup interval and the first power pulse interval overlap time-wise.

4. Method according to claim 1, wherein the first power pulse interval and the second power pulse interval overlap time-wise, wherein the first power pulse interval starts temporally before the second power pulse interval and the first power pulse interval ends temporally before the second power pulse interval.

5. Method according to claim 1, wherein the power consumption component is a dummy cathode, which serves as a power absorber and not as a material supplier for the substrates to be coated or processed.

6. Method according to claim 1, wherein the power consumption component is executed with an electric circuit with an ohmic resistance at which a corresponding voltage drops and the power is converted into heat.

7. Method according to claim 3, wherein the power consumption component is a dummy cathode, which serves as a power absorber and not as a material supplier for the substrates to be coated or processed.

8. Method according to claim 3, wherein the power consumption component is executed with an electric circuit with an ohmic resistance at which a corresponding voltage drops and the power is converted into heat.

* * * * *